United States Patent [19]
Wang et al.

[11] Patent Number: 5,646,061
[45] Date of Patent: Jul. 8, 1997

[54] TWO-LAYER POLYSILICON PROCESS FOR FORMING A STACKED DRAM CAPACITOR WITH IMPROVED DOPING UNIFORMITY AND A CONTROLLABLE SHALLOW JUNCTION CONTACT

[75] Inventors: Chen-Jong Wang; Mong-Song Liang, both of Hsin-Chu, Taiwan

[73] Assignee: Taiwan Semiconductor Manufacturing Company, Ltd., Hsin-Chu, Taiwan

[21] Appl. No.: 635,829

[22] Filed: Apr. 22, 1996

[51] Int. Cl.$^6$ ............................ H01L 21/70; H01L 27/00
[52] U.S. Cl. ............................ 437/52; 437/60; 437/919
[58] Field of Search ............................ 437/52, 60, 919, 437/47

[56] References Cited

U.S. PATENT DOCUMENTS

| | | | |
|---|---|---|---|
| 4,951,175 | 8/1990 | Kurosawa et al. | 361/313 |
| 5,114,873 | 5/1992 | Kim et al. | 437/52 |
| 5,216,267 | 6/1993 | Jin et al. | 257/306 |
| 5,309,023 | 5/1994 | Moritonami et al. | 257/773 |
| 5,389,575 | 2/1995 | Chin et al. | 437/190 |
| 5,395,784 | 3/1995 | Lu et al. | 437/52 |
| 5,444,653 | 8/1995 | Nagasawa et al. | 365/149 |

OTHER PUBLICATIONS

Wolf et al., silicon process for the VLSI Era, vol. 1, pp. 551–557, 1986, Lattice Press.
S. Wolf, "Silicon Processing for the VLSI Era–vol. 2" Lattice Press, Sunset Beach, CA, p. 157.

*Primary Examiner*—Jey Tsai
*Attorney, Agent, or Firm*—George O. Saile

[57] ABSTRACT

A method for forming a lower plate of a STC DRAM storage capacitor and its contact to the source diffusion of the transfer MOSFET is described which reduces the risk of dopant encroachment into shallow active device regions within a silicon wafer, without sacrificing contact stability and integrity. In addition, the storage capacitor does not suffer appreciable voltage degradation caused by carrier depletion in its lower plate. This is accomplished by depositing a thick, in-situ doped first layer of polysilicon over an insulating layer which covers the semiconductor device. Next, a contact opening is made and a thin layer of undoped polysilicon is deposited to complete the lower plate. In one embodiment this layer is not subsequently doped by ion implantation but receives an infusion of dopant from the first polysilicon layer during an annealing step. The annealing step affords a stable, ohmic contact with good capacitive-voltage characteristics. In another embodiment a shallow oblique implant is introduced into the thin polysilicon layer to further improve the capacitive characteristics.

26 Claims, 5 Drawing Sheets

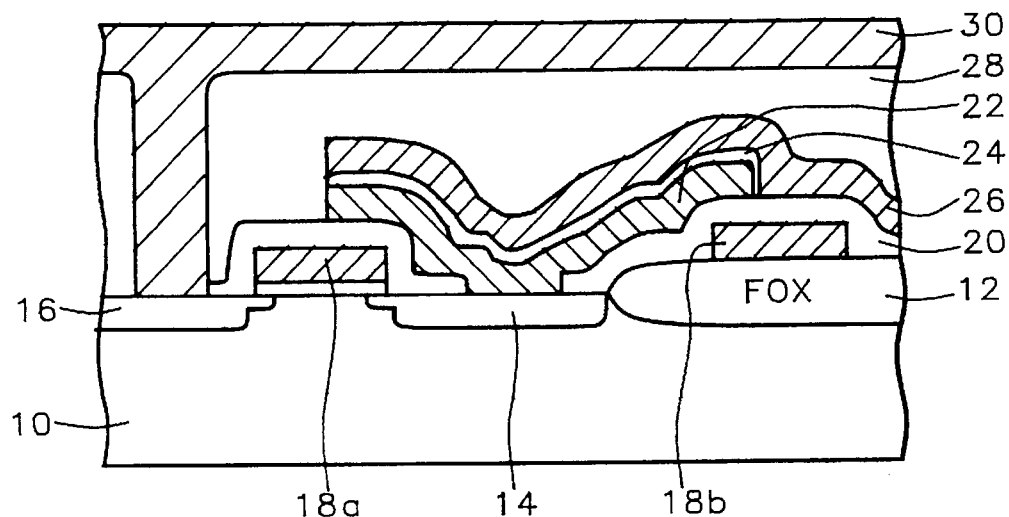
FIG. 1 - Prior Art
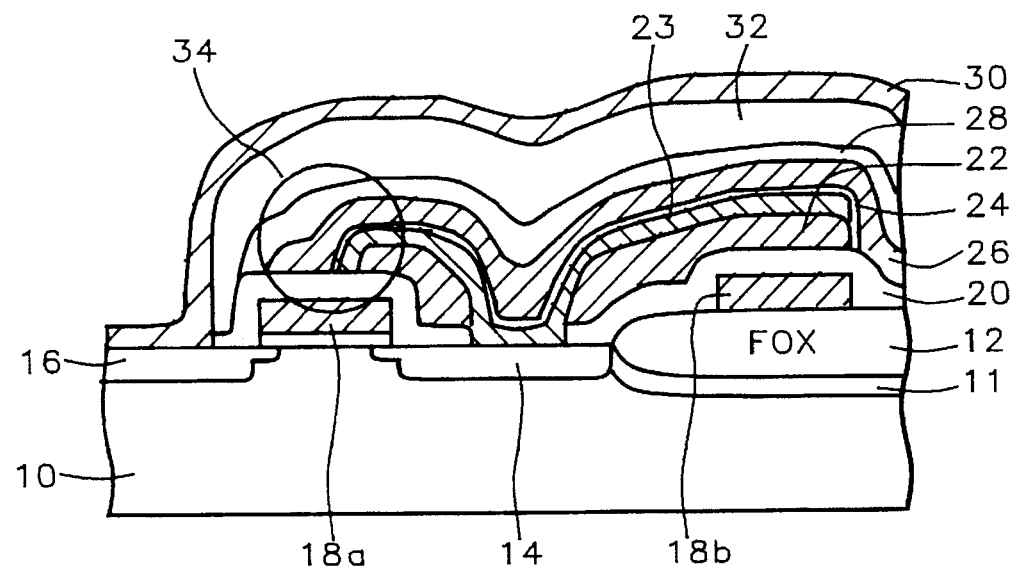
FIG. 2 - Prior Art

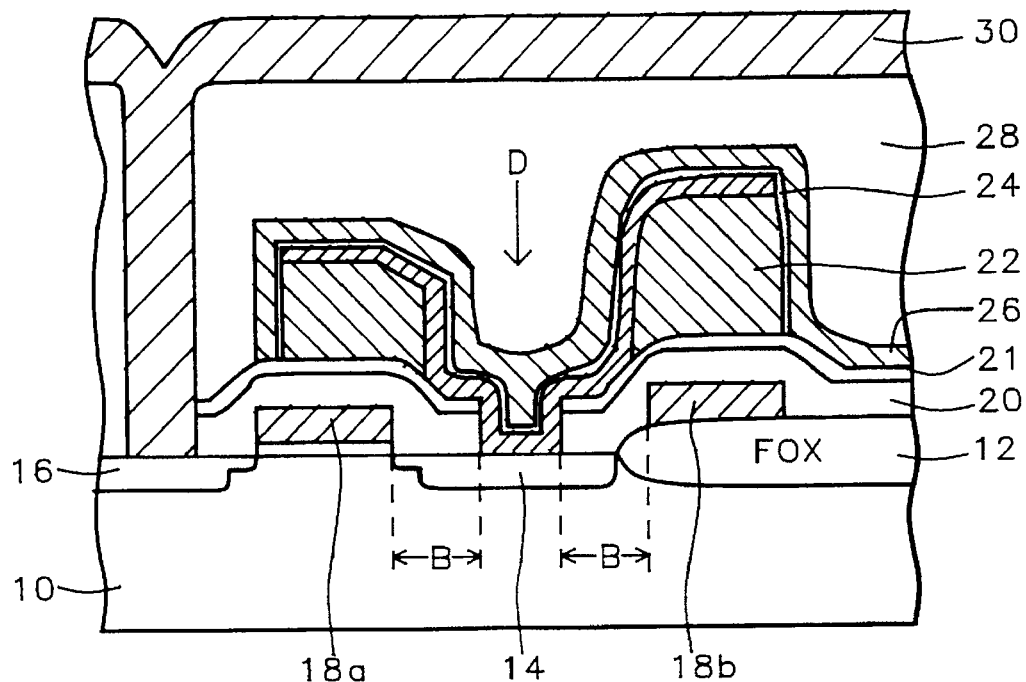
FIG. 3 – Prior Art
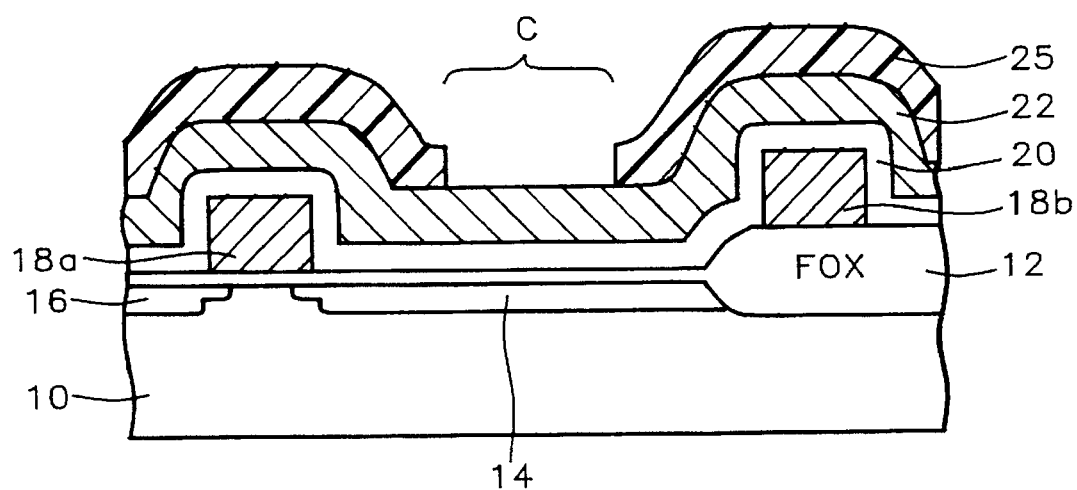
FIG. 4A

TWO-LAYER POLYSILICON PROCESS FOR FORMING A STACKED DRAM CAPACITOR WITH IMPROVED DOPING UNIFORMITY AND A CONTROLLABLE SHALLOW JUNCTION CONTACT

BACKGROUND OF THE INVENTION (1) Field of the Invention

The invention relates to processes for the manufacture of semiconductor devices and more particularly to processes for forming DRAM devices.

(2) Description of Prior Art

Computer memory consist of vast arrays of storage cells which can be addressed by wordlines and bitlines. The most commonly used cell design used in current dynamic random access memories(DRAMS) comprise a transfer gate(usually an MOS field-effect-transistor(MOSFET) and a storage node consisting of a capacitor. DPAM cells are, by necessity of high density requirements, of the simplest design possible and to this end, the MOSFET-capacitor combination serves quite well.

The quest for miniaturization and the increasing demand for higher and higher densities of memory cells has resulted in many design variations of these simple MOSFET memory cells. One such design, referred to as the stacked capacitor cell(STC) DRAM, lends itself particularly well to extensive miniaturization within the framework of MOSFET technology, while at the same time maintaining adequate storage capability.

Miniaturization of the MOSFET has led to current DRAM designs using sub-half-micron ground rules. The DRAM capacitor, which resides atop the source diffusion of the MOSFET in the STC design, has been modified considerably over the last five years in order to keep up with the decreasing area available to it. Thus, much attention has been given to designing the capacitor in a smaller and smaller physical area without sacrificing capacitance.

An early DRAM cell design is illustrated in cross section by FIG. 1. The silicon wafer substrate 10 contains the source 14 and the drain 16 diffusions for the MOSFET whose polysilicon gate 18a is part of a word line extending perpendicular to the page. The wordline 18b forms the gates of other MOSFETs above and below the plane of the page. The polysilicon bottom plate of the storage capacitor 22 lies over an insulating layer 20 and is makes electrical contact to the source 14. The upper plate of the capacitor 26 rests upon the capacitors dielectric layer 24 and is covered by insulating layer 28. The bitline 30 is connected to the drain of the MOSFET.

Subsequent designs first by Kurosawa et.al. U.S. Pat. No. 4,951,175(1990) and later by Jin et.al. U.S. Pat. No. 5,216, 267(1993) developed the concept of forming the lower electrode by first depositing a thick layer of polysilicon over the first insulating layer, then opening the source contact, and finally depositing a thinner polysilicon layer. In this way they were able to obtain some additional capacitor plate area as well as provide better control over the contact opening to the MOSFET source. The details of Jin et.al.s version is depicted in FIG. 2. This version is basically similar to that of Kurosawa et.al. except for a modification within the circle 34 and the addition of a flattening layer of borophosphosilicate glass(BPSG) 32 the purpose of which is to provide a gentler slope for the bitline 30.

Nagasawa et.al. U.S. Pat. No. 5,444,653(1995) took this concept a step further by making the first polysilicon layer 22 of the lower capacitor plate even thicker (6,000 Angstroms) and folding the capacitor down in the center (FIG.3) to make even greater plate area gains. In addition, by using a two-step etching procedure to form the contact opening D, the insulator spacing between the polysilicon gates and the capacitor contact (B) was improved. A further benefit achieved by this innovation was to reduce the danger of dopant encroachment from the polysilicon at the contact into the lightly-doped(LDD) region 14a of the source 14. The etching procedure utilizes oxide sidewalls and a layer of silicon nitride 21 as an etch stop.

Both Jin et.al. and Nagasawa et.al. provide n+ doping for both first and second layers of polysilicon which form the bottom plate of the capacitor. Kurosawa et.al. do not indicate a method of doping of the first(thicker) layer but do state that the second(thinner) layer is deposited about 500 Angstroms thick and that an ion implantation of arsenic takes place to a depth comparable to the thickness of the layer. They suggest $1\times10^{16}$ cm$^2$ at 60 keV which places the implant at a depth of about 400 Angstroms.

Motonami, et.al. U.S. Pat. No. 5,309,023(1994), like Nagasawa et.al., consider the risks of dopant encroachment from the DRAM capacitor lower plate contacts. They cite misalignment as a potential cause for this infiltration in particular into the LLD region. The increased concern for such encroachment is a direct consequence of continuing shrinkage of device design parameters which dictate very shallow junctions and tight alignment tolerances. The sub-half-micron design features of today demand a greater inclination to avoid potential device active area disruptions by subsequent processing. At the same time, the requirements for a stable, low-resistance(Ohmic) contact, become more sacrosanct. To this end, the introduction of additional dopant by implant at the capacitor lower plate source contact imposes risk. In particular, when very shallow junctions are involved, encroachment of the implant into the junction region is difficult to avoid.

SUMMARY OF THE INVENTION

It is an object of this invention to provide an improved method for forming a contact of the lower plate of a STC DRAM storage capacitor to the source diffusion of the transfer MOSFET. The method reduces the risk of dopant encroachment into active device regions within the single-crystalline semiconductor substrate wafer without sacrificing contact stability and integrity, and without compromising the response characteristics of the storage capacitor.

This object is accomplished depositing a thick, in-situ doped first layer of polysilicon over an insulating layer which covers the semiconductor devices. Next, a contact opening is made through the first polysilicon layer and the insulating layer, exposing the source diffusion of the transfer MOSFET. The preceding steps are in keeping with prior art. Next a second, much thinner, layer of undoped polysilicon is deposited over the first polysilicon layer and also along the walls and bottom of the contact opening. The introduction of additional dopant into the second polysilicon layer is not required although a very low dosage implant into its upper surface may be permitted. The substrate wafer is subjected to a thermal anneal which stabilizes the contact bond of the second polysilicon layer and permits a controlled amount of dopant to flow into it from the first polysilicon layer where the two are in contact. Appropriately, some dopant from the interface region of the source will flow into the polysilicon at the contact.

BRIEF DESCRIPTION OF THE DRAWINGS

FIG. 1 is a cross section of a prior art STC DRAM which uses a single polysilicon layer for the capacitor lower plate.

FIG. 2 is a cross section of a prior art STC DRAM which uses a two-layer polysilicon capacitor lower plate.

FIG. 3 is a cross section of a more recent modification of a STC DRAM cell which provides increased capacitor plate area and a reduced contact size.

FIGS. 4A–4C are cross sections of a DRAM cell during the processing steps where this invention is introduced.

DESCRIPTION OF THE PREFERRED EMBODIMENTS

Accordingly, a preferred embodiment of this invention is hereby described. A p-doped <100> oriented monocrystalline silicon wafer substrate is provided. The wafer is processed using the conventional DRAM manufacturing procedures to the point where n-channel MOSFET devices have been formed within the wafer surface, self-aligned polysilicon gates have been provided, and an insulating layer consisting of a silicate glass has been deposited over the entirety.

Referring first to FIG.4A, a layer of polysilicon 22 is deposited over the silicate glass insulating layer 20 using low-pressure-chemical-vapor-deposition(LPCVD) using silane and hydrogen. The layer is between 1,000 and 3,000 Angstroms thick and is deposited at a temperature of about 570° C. During the deposition phosphorous in the form of phosphine($PH_3$) is incorporated into the gas stream to uniformly dope the polysilicon layer n-type. The wafer is then coated with photoresist 25 and patterned to define the contact opening C. Reactive-ion-etching utilizing chlorine and argon is used to provide vertical walled openings in the polysilicon layer. When the silicate glass layer beneath the polysilicon has been exposed, the RIE etchant gas is altered to contain tetrafluoromethane($CF_4$) instead of chlorine and etching is continued under conditions which provide a high silicate glass-to-silicon etch rate ratio until the subjacent single crystal silicon surface is exposed.

Figure 4B:
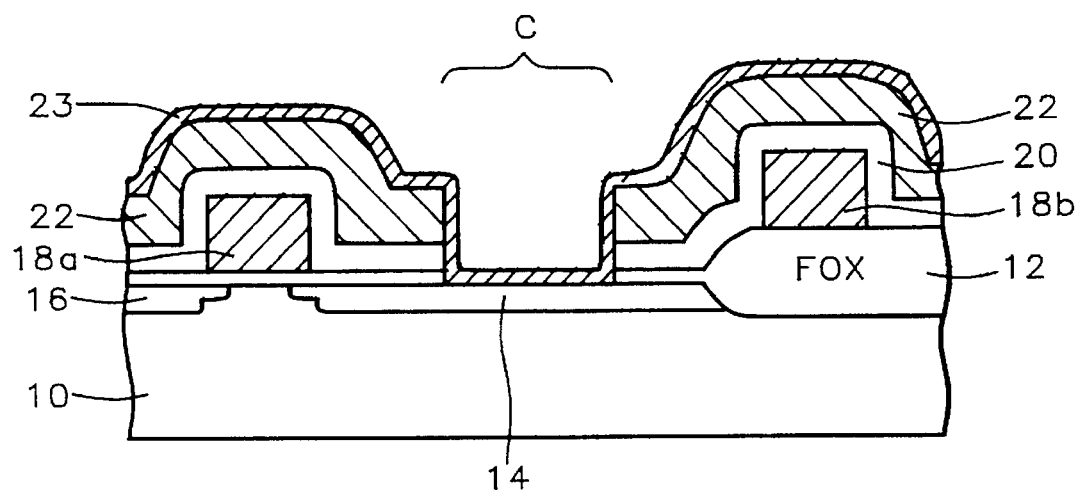

Referring now to FIG.4B the photoresist has been removed using conventional photoresist stripping techniques. The wafer is next given a brief dip in 100:1 diluted hydrofluoric acid to provide a clean silicon surface, free of any native silicon oxide layer. A second layer of polysilicon 23 is next deposited by LPCVD at a temperature of about 620° C. using silane and hydrogen but without the addition of dopant gases. This undoped polysilicon layer 23 is between about 500 to 1,000 Angstroms thick.

Figure 5:
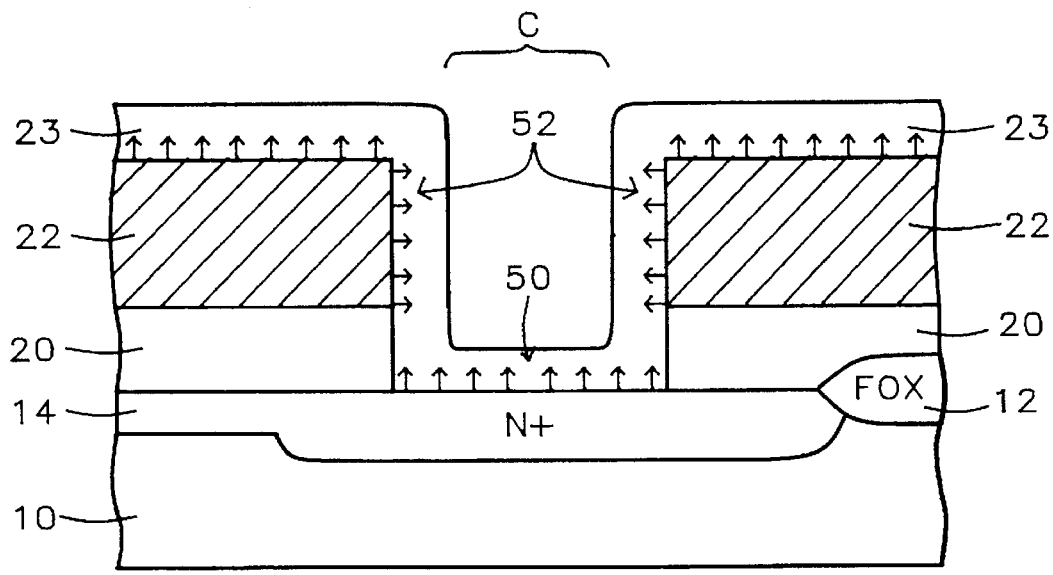
FIG. 5 is a cross section of the source contact region of a STC DRAM having a two-layer polysilicon lower capacitor plate.

The wafer is next annealed in nitrogen in a furnace for a period of about 30 to 60 minutes. FIG.5 is a cross section showing second polysilicon layer in detail in the region of the contact opening C. The temperature of the anneal is between 800° C. and 900° C. During this period, bonding of the polysilicon and the substrate to takes place and some dopant from the source region flows into the polysilicon at the contact 50 resulting in the formation of a stable, low-resistance contact. At the same time, dopant from the first polysilicon layer diffuses into the second polysilicon layer over the region where the two adjoin 52.

Figure 4C:
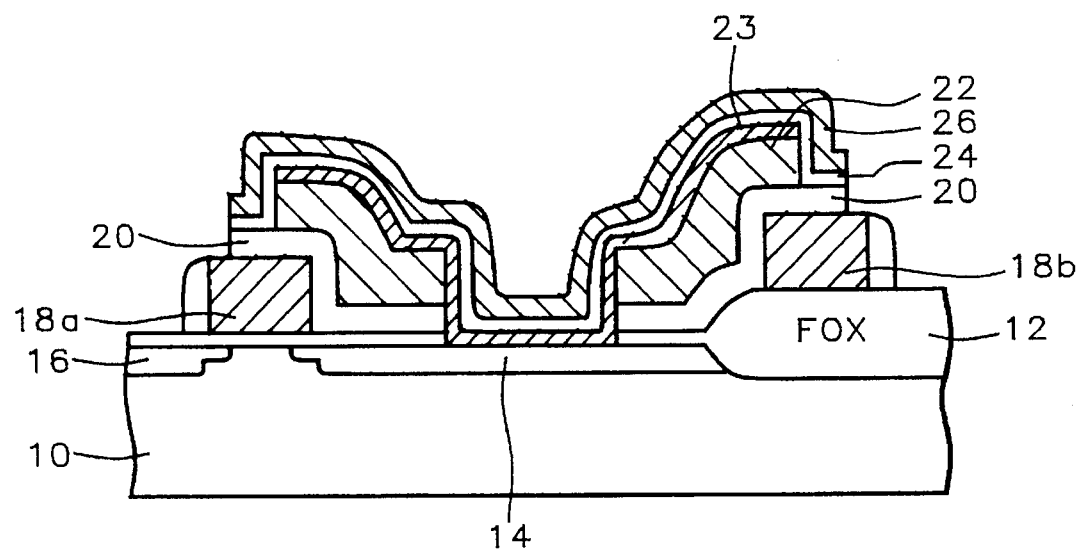

Referring next to FIG.4C, the composite polysilicon lower capacitor plate 22,23 is next defined by photoresist and the plate is etched in the conventional manner. A dielectric material 24 consisting of a composite layer of silicon oxide and silicon nitride is deposited over the lower capacitor plate 23 by LPCVD. The dielectric layer is about 40 to 80 Angstroms thick overall. The upper capacitor plate 26, which consists of a layer of in-situ doped polysilicon is deposited by LPCVD at 570° C. over the dielectric layer 24, using the same chemistry as the first polysilicon layer.

Photoresist is next used to pattern the completed storage capacitor which, after conventional RIE, is depicted in FIG.4C. Subsequent processing then proceeds according to prior art in FIG. 1 by forming an insulating layer 28 and a bit line 30 which makes contact to the drain region 16 of the transfer transistor.

Figure 6A:
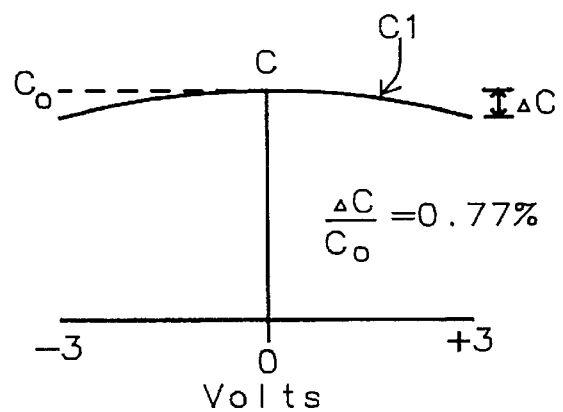
FIG. 6A shows the capacitance-voltage characteristic of STC DRAM capacitors having a lower plate configuration fabricated according to this invention.
Figure 6B:
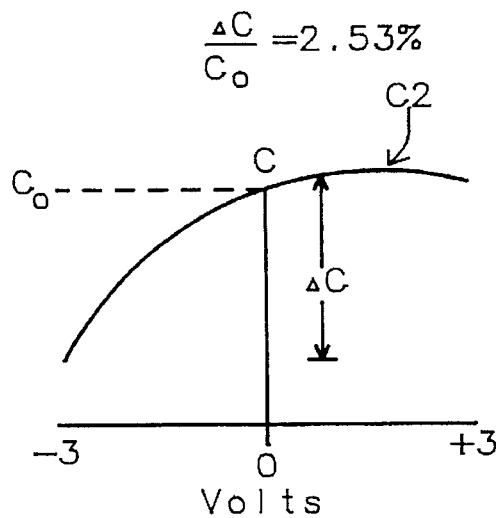
FIG. 6B shows the capacitance-voltage characteristic of STC DRAM capacitors having a lower plate configuration fabricated according to prior art.

Referring next to FIG.6A, there is shown as curve C1, the capacitance vs. voltage behavior of a DRAM storage capacitor having a structure corresponding to that shown in FIG.4C as taught by this embodiment. It has a 550 Angstrom thick undoped polysilicon layer 23 over a 2000 Angstrom thick doped layer 22. For comparison there is also shown in FIG.6B, curve C2, which is the capacitance voltage characteristic of a DPAM storage capacitor having the prior art structure corresponding that shown in FIG.1 and having the bottom plate of the capacitor 22 consisting of 1500 Angstroms of in-situ doped polysilicon deposited over 1000 Angstroms of undoped polysilicon. The unacceptable capacitance fall-off with voltage is caused by to carrier depletion in the large area of undoped silicon in the prior art capacitor. The reduction of undoped silicon area and thickness offered by this invention through the annealing step is reflected by the reduced variation of capacitance with voltage.

Figure 7:
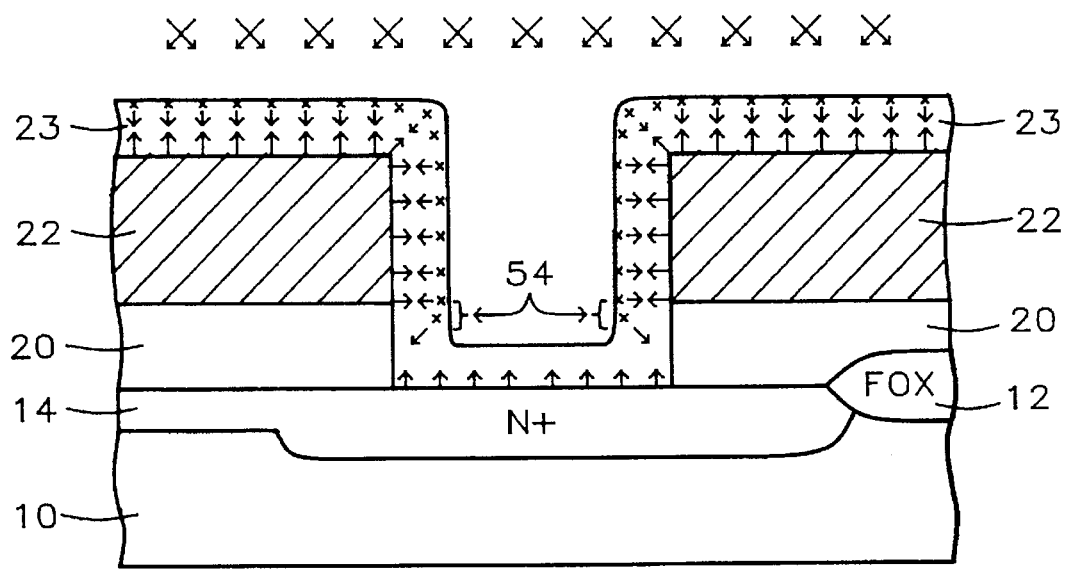
FIG. 7 is a cross section detailing a shallow large-angle-tilt implanted polysilicon layer in the contact region of a STC DRAM capacitor.

In another embodiment of this invention shown in FIG.7, a shallow, oblique, low dosage arsenic ion-implant is performed after the deposition of the second polysilicon layer. The implant is performed at 20 to 30 keV at a dose of about $1\times10^{16}$ atoms/$cm^2$ using oblique or large-angle-tilt(LAT) implantation. The center of the dose is thus placed at a depth of about 200 Angstroms with a straggle of about ±70 Angstroms(depending upon the tilt). After the anneal, this implant supplements the doping at the upper surface of the polysilicon layer, further improving the capacitance-voltage characteristic of the storage capacitor. In addition the utilization of LAT provides dopant in the sidewall regions 54 of polysilicon layer 23 adjacent to the insulating layer 20 thereby lowering the resistance there, while at the same time driving little or no dopant into the bottom of the opening where it is not wanted.

The embodiments described use a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations are encountered in twin-well CMOS technology.

Whereas the thick polysilicon layer 22 was in-situ doped with phosphorous using phosphine, arsenic in the form of arsine($AsH_3$) could be used with similar achievement to provide an n-type layer. If the transfer transistors were p-channel devices, the dopant incorporated into the polysilicon layer 22 would then appropriately be boron.

While the invention has been particularly shown and described with reference to the preferred embodiments thereof, it will be understood by those skilled in the art that various changes in form and details may be made without departing from the spirit and scope of the invention.

What is claimed is:

1. A method for forming the lower plate of a capacitor and its contact to a semiconductor device on a silicon wafer comprising:
   (a) providing a silicon wafer having a semiconductor device formed within its surface;
   (b) forming an insulative layer over said silicon wafer;
   (c) forming a conductive layer over said silicon wafer;
   (d) depositing a first photoresist layer over said silicon wafer;
   (e) patterning said first photoresist layer to define a contact opening to an active area of said semiconductor device;
   (f) etching said conductive layer and said insulative layer with a unidirectional etching technique to provide a vertical walled opening exposing said active area of said semiconductor device;
   (g) removing said first photoresist layer;
   (h) depositing an un-doped polysilicon layer;
   (i) annealing said silicon wafer;
   (j) depositing a second photoresist layer;
   (k) patterning said second photoresist layer to define said lower plate of said capacitor; and
   (l) etching said un-doped polysilicon layer and said conductive layer with a unidirectional etching technique to expose said insulative layer around said lower plate.

2. The method of claim 1 wherein the insulative layer. is one selected from the group consisting of silicon oxide, a borosilicate glass, and a borophosphosilicate glass.

3. The method of claim 1 wherein said conductive layer is between about 2,000 and 3,000 Angstroms thick.

4. The method of claim 1 wherein said conductive layer is polysilicon deposited by LPCVD by the pyrolysis of silane in hydrogen at a temperature between about 560° C. and 580° C.

5. The method of claim 4 wherein the polysilicon is in-situ doped with an impurity selected from the group consisting of phosphorous, arsenic, and antimony.

6. The method of claim 1 wherein said unidirectional etching technique is reactive-ion-etching.

7. The method of claim 1 wherein said un-doped polysilicon layer is between about 500 and 1,000 Angstroms thick.

8. The method of claim 1 wherein said un-doped polysilicon layer is deposited by LPCVD by the pyrolysis of silane in hydrogen at a temperature between about 600° C. and 630° C.

9. The method of claim 1 wherein an oblique implant of an impurity is performed at an incident angle of between 25 to 60 degrees from the normal to said silicon wafer between step (h) and step (i).

10. The method of claim 9 wherein said impurity is arsenic implanted at an energy of between about 20 to 30 keV and a dose of between about $1 \times 110^{14}$ to $1 \times 10^{16}$ atoms/cm$^2$.

11. The method of claim 1 wherein said annealing is performed in a furnace between about 800° C. and 900° C. for a period of between about 30 and 60 minutes.

12. A method for forming a STC DRAM memory cell comprising:
   (a) providing a silicon wafer having a self-aligned-polysilicon gate MOSFET formed on its surface;
   (b) forming a first insulative layer over said silicon wafer;
   (c) forming a first conductive layer over said silicon wafer;
   (d) depositing a first photoresist layer over said silicon wafer;
   (e) patterning said first photoresist layer to define a contact opening to the source region of said self-aligned-polysilicon gate MOSFET;
   (f) etching said first conductive layer and said insulative layer with a unidirectional etching technique to provide a vertical walled opening exposing a source region;
   (g) removing said first photoresist layer;
   (h) depositing an un-doped polysilicon layer;
   (i) annealing said silicon wafer;
   (j) depositing a second photoresist layer;
   (k) patterning said second photoresist layer to define the lower plate of the storage capacitor for said STC DRAM cell;
   (l) etching said un-doped polysilicon layer and said first conductive layer with a unidirectional etching technique to expose said insulative layer around said lower plate;
   (m) depositing a dielectric layer;
   (n) depositing a second conductive layer;
   (o) depositing a third photoresist layer;
   (p) patterning said third photoresist layer to define the upper plate of said storage capacitor;
   (q) etching said second conductive layer with a unidirectional etching technique to form said upper plate;
   (r) depositing a second insulative layer;
   (s) depositing and patterning a fourth photoresist layer to define the bit line contacts of said STC DRAM memory cell over the drain region of said self-aligned-polysilicon gate MOSFET;
   (t) etching said bit-line contacts;
   (u) depositing a third conductive layer;
   (v) depositing and patterning a fifth photoresist layer to define a bit line of said STC DRAM memory cell;
   (w) etching said third conductive layer to form a bit-line.

13. The method of claim 12 wherein the first insulative layer and the second insulative layer is one selected from the group consisting of silicon oxide, a borosilicate glass, and a borophosphosilicate glass.

14. The method of claim 12 wherein the first conductive layer is between about 2,000 and 3,000 Angstroms thick.

15. The method of claim 12 wherein the first conductive layer is polysilicon deposited by LPCVD by the pyrolysis of silane in hydrogen at a temperature between about 560° C. and 580° C.

16. The method of claim 15 wherein the polysilicon is in-situ doped with an impurity selected from the group consisting of phosphorous, arsenic, and antimony.

17. The method of claim 12 wherein said unidirectional etching technique is reactive-ion-etching.

18. The method of claim 12 wherein said un-doped polysilicon layer is between about 500 and 1,000 Angstroms thick.

19. The method of claim 12 wherein said un-doped polysilicon layer is deposited by LPCVD by the pyrolysis of silane in hydrogen at a temperature between about 600° C. and 630° C.

20. The method of claim 12 wherein an oblique implant of an impurity is performed at an incident angle of between 25 to 60 degrees from the normal to said silicon wafer between step (h) and step (i).

21. The method of claim 20 wherein said impurity is arsenic implanted at an energy of between about 20 to 30 keV and a dose of between about $1\times10^{14}$ to $1\times10^{16}$ atoms/cm$^2$.

22. The method of claim 12 wherein said annealing is performed in a furnace between about 800° C. and 900° C. for a period of between about 30 and 60 minutes.

23. The method of claim 12 wherein the dielectric layer is one selected from the group consisting of a layer of silicon nitride over a layer of silicon oxide(ON) and a layer of silicon nitride between two layers of silicon oxide(ONO).

24. The method of claim 12 wherein the dielectric layer is between about 40 to 80 Angstroms thick.

25. The method of claim 12 wherein said second conductive layer is deposited by LPCVD at a temperature between about 510° C. to 620° C.

26. The method of claim 12 wherein said second conductive layer is in-situ doped with an impurity selected from the group consisting of phosphorous, arsenic, and antimony.

* * * * *